United States Patent
Kumar et al.

(10) Patent No.: US 7,431,795 B2
(45) Date of Patent: Oct. 7, 2008

(54) CLUSTER TOOL AND METHOD FOR PROCESS INTEGRATION IN MANUFACTURE OF A GATE STRUCTURE OF A FIELD EFFECT TRANSISTOR

(75) Inventors: Ajay Kumar, Sunnyvale, CA (US); Ramesh Krishnamurthy, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 436 days.

(21) Appl. No.: 10/909,009

(22) Filed: Jul. 29, 2004

(65) Prior Publication Data

US 2006/0021702 A1 Feb. 2, 2006

(51) Int. Cl.
*C23F 1/00* (2006.01)
*H01L 21/306* (2006.01)
*C23C 16/00* (2006.01)

(52) U.S. Cl. ............... 156/345.32; 156/345.24; 156/345.31; 118/719

(58) Field of Classification Search ............ 156/345.24, 156/345.31, 345.32
See application file for complete search history.

(56) References Cited

U.S. PATENT DOCUMENTS

| 5,340,438 | A | * | 8/1994 | Roselle et al. | 216/39 |
| 5,965,034 | A | * | 10/1999 | Vinogradov et al. | 216/68 |
| 6,492,222 | B1 | * | 12/2002 | Xing | 438/240 |
| 6,579,809 | B1 | * | 6/2003 | Yang et al. | 438/734 |
| 6,759,286 | B2 | * | 7/2004 | Kumar et al. | 438/177 |
| 6,767,824 | B2 | * | 7/2004 | Nallan et al. | 438/633 |
| 6,875,664 | B1 | * | 4/2005 | Huang et al. | 438/299 |
| 6,893,974 | B1 | * | 5/2005 | Sedigh et al. | 438/714 |
| 6,924,191 | B2 | * | 8/2005 | Liu et al. | 438/241 |
| 6,960,416 | B2 | * | 11/2005 | Mui et al. | 430/30 |

(Continued)

OTHER PUBLICATIONS

U.S. Appl. No. 10/358,970, filed Feb. 4, 2003, Kumar et al.

(Continued)

*Primary Examiner*—Karla Moore
(74) *Attorney, Agent, or Firm*—Moser IP Law Group

(57) ABSTRACT

A method and apparatus for process integration in manufacture of a gate structure of a field effect transistor are disclosed. The method includes assembling an integrated substrate processing system having a metrology module and a vacuumed processing platform to perform controlled and adaptive plasma processes without exposing the substrate to a non-vacuumed environment.

11 Claims, 13 Drawing Sheets

U.S. PATENT DOCUMENTS

| | | |
|---|---|---|
| 2002/0015855 A1* | 2/2002 | Sajoto et al. ............... 428/639 |
| 2002/0155629 A1* | 10/2002 | Fairbairn et al. .............. 438/14 |
| 2003/0057432 A1* | 3/2003 | Gardner et al. ............. 257/100 |
| 2003/0170986 A1 | 9/2003 | Nallan et al. |
| 2003/0211748 A1 | 11/2003 | Jin et al. |
| 2003/0228532 A1* | 12/2003 | Mui et al. ..................... 430/30 |
| 2004/0002223 A1 | 1/2004 | Nallan et al. |
| 2004/0007661 A1 | 1/2004 | Nallan et al. |
| 2004/0009834 A1 | 1/2004 | Nallan et al. |
| 2004/0018736 A1 | 1/2004 | Liu |
| 2004/0043623 A1 | 3/2004 | Liu et al. |
| 2004/0053484 A1 | 3/2004 | Kumar et al. |
| 2004/0056517 A1 | 3/2004 | Nallan et al. |
| 2004/0058517 A1* | 3/2004 | Nallan et al. ................ 438/585 |
| 2004/0072446 A1 | 4/2004 | Liu et al. |
| 2004/0097092 A1 | 5/2004 | Nallan et al. |
| 2004/0132311 A1 | 7/2004 | Nallan et al. |
| 2004/0173572 A1 | 9/2004 | Nallan et al. |
| 2004/0203251 A1* | 10/2004 | Kawaguchi et al. ......... 438/727 |
| 2004/0206724 A1 | 10/2004 | Nallan et al. |
| 2004/0209468 A1 | 10/2004 | Kumar et al. |
| 2005/0014380 A1* | 1/2005 | Kai et al. .................... 438/706 |

OTHER PUBLICATIONS

U.S. Appl. No. 10/865,934, filed Sep. 19, 2003, Liu et al.

* cited by examiner

US 7,431,795 B2

CLUSTER TOOL AND METHOD FOR PROCESS INTEGRATION IN MANUFACTURE OF A GATE STRUCTURE OF A FIELD EFFECT TRANSISTOR

BACKGROUND OF THE INVENTION

1. Field of the Invention

The present invention generally relates to a cluster tool and method of fabricating devices on semiconductor substrates. More specifically, the present invention relates to a cluster tool and method for process integration in manufacture of field effect transistors.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric. The gate electrode is disposed over the gate dielectric to control a flow of charge carriers in a channel region formed between the drain and source regions beneath the gate dielectric. To increase the speed of the transistor, the gate dielectric may be formed from a material having a dielectric constant greater than 4.0. Herein such dielectric materials are referred to as high-k materials.

Fabrication of gate structures of field effect transistors having the high-k gate dielectric comprises a series of processing steps (e.g., etching steps and the like) and control steps (e.g., measuring steps) which are performed using various substrate processing reactors and metrology tools. While maintaining vacuumed processing chambers, such reactors operate in atmospheric-pressure manufacturing regions of a semiconductor fab and are coupled together and with the metrology tools using atmospheric-pressure factory interfaces (i.e., transports for cassettes with the substrates).

In non-vacuumed environment, the substrates are exposed to mechanical and chemical contaminants, such as particles, traces of gaseous halogen-based reactants, and the like, that may damage the gate structures being fabricated. As gate structures become smaller and/or thinner to increase the device speed, the risk of contamination becomes increased. Additionally, the time spent on transferring the substrate between the processing reactors and between the processing reactors and metrology tools decreases productivity in manufacture of the field effect transistors.

Therefore, there is a need in the art for an improved cluster tool and method for process integration in manufacture of gate structures of field effect transistors.

SUMMARY OF THE INVENTION

A cluster tool and method for process integration in manufacture of field effect transistors having high-k gate dielectric are disclosed. The method includes assembling an integrated substrate processing system (e.g., cluster tool) including a metrology module and a vacuumed processing platform that performs controlled and adaptive plasma processes without exposing the substrate to a non-vacuumed environment.

In one embodiment, the metrology module defines dimensions of a photoresist patterned mask of the gate structure and then the substrate is transferred to the processing platform, where processes of controlled trimming the patterned mask to a pre-determined width, forming a hard etch mask, and fabricating the gate structure having a high-k gate dielectric are performed without exposing the substrate to a non-vacuumed environment. From the processing platform, the substrate is transferred to the metrology module for measuring dimensions of the gate structure and providing feedback data for adjusting operation of the processing platform.

The integrated substrate processing system for performing the inventive method comprises a metrology module employing at least one non-destructive measuring technique and a computerized vacuum-tight processing platform having at least one substrate processing module (e.g., plasma etch module, plasma ashing module, and the like), and at least one load-lock chamber coupled to a common substrate transfer chamber.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a cluster tool and method for process integration in manufacture of a gate structure of a field effect transistor having a high-k gate dielectric, such as a complementary metal-oxide-semiconductor (CMOS) field effect transistor, and the like. The invention may be used for fabricating ultra-large-scale integrated (ULSI) semiconductor devices and circuits.

Figure 1:
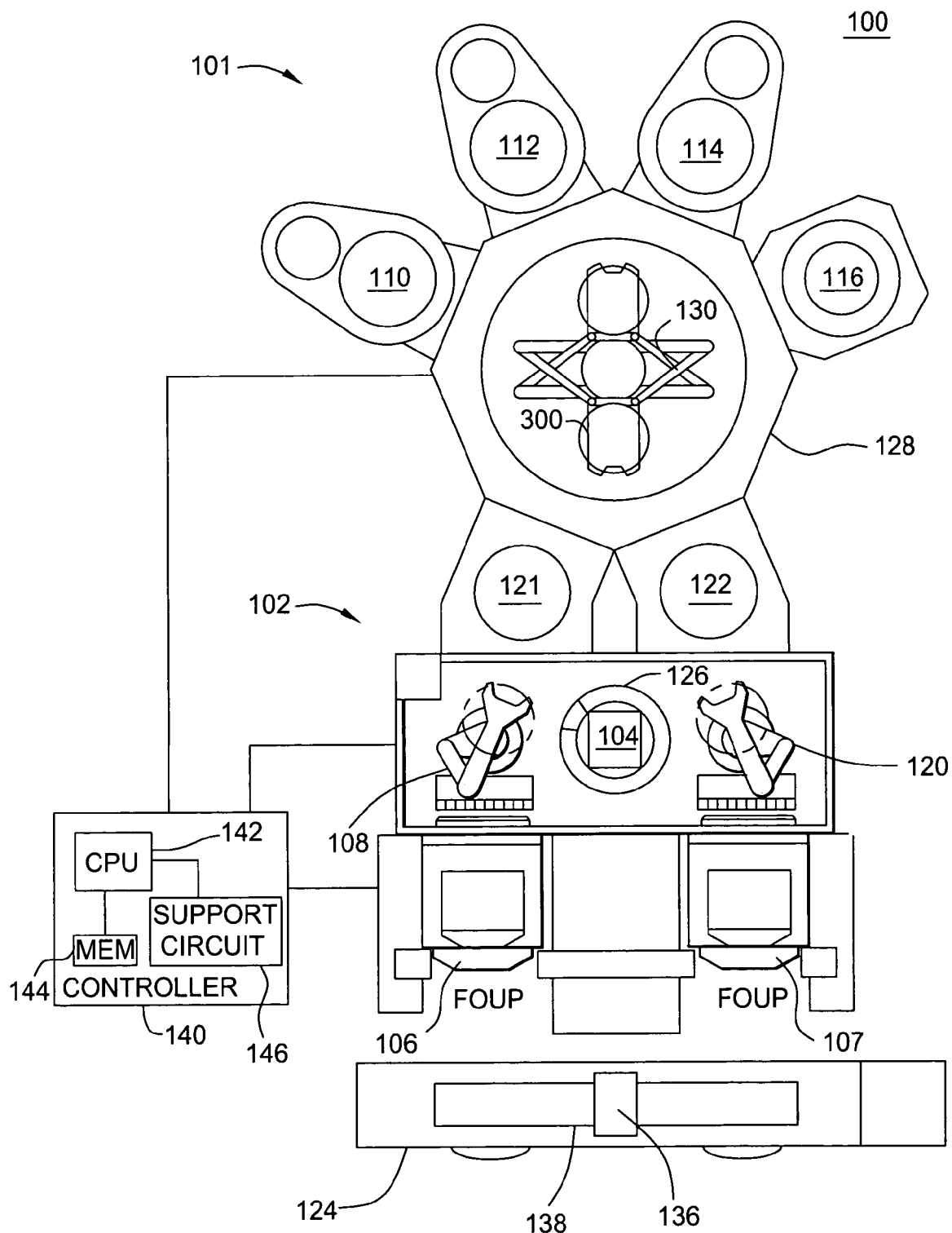
FIG. 1 depicts a schematic diagram of an exemplary integrated semiconductor substrate processing system (e.g., cluster tool) of the kind used in one embodiment of the invention.

FIG. 1 depicts a schematic diagram of an exemplary integrated semiconductor substrate processing system (e.g., cluster tool) 100 of the kind used in one embodiment of the invention.

The system 100 illustratively includes a vacuum-tight processing platform 101, an input/output module 102, and a system controller 140. In one embodiment, the platform 101 comprises processing modules 110, 112, 114 and 116 and at least one load-lock chamber (load-lock chambers 121 and 122 are shown), which are coupled to a common vacuumed substrate transfer chamber 128.

The load-lock chambers 121 and 122 protect the transfer chamber 128 from atmospheric contaminants. The transfer chamber 128 comprises a substrate robot 130. In operation, the robot 130 transfers the substrates between the load lock chambers and processing modules. The depicted embodiment of the robot 130 is exemplary and should not limit the scope of the invention.

At least one of the processing modules 110, 112, 114 and 116 may be a plasma etch module and at least a second of the processing modules may be a plasma ashing module. Examples of plasma etch and ashing modules suitable for use in the invention are the DPS® II, DPS® II HT, and AXIOM™ modules available from Applied Materials, Inc. of Santa Clara, Calif. and discussed below in reference to FIGS. 5 and 6, respectively.

The input/output module 102 comprises a metrology module 126, at least one docking station to accept one or more front opening unified pod (FOUP) (FOUPs 106 and 107 are shown) and at least one substrate robot (two robots 108 and 120 are shown). In one embodiment, the metrology module 126 comprises a measuring tool 104 employing at least one non-destructive measuring technique suitable for measuring critical dimensions of structures formed on the substrate. One suitable measuring tool 104 that optically measures critical dimensions is available from Nanometrics, located in Milpitas, Calif. The robots 108 and 120 transfer the pre-processed and post-processed substrates between the FOUPs 106, measuring tool 104, and load-lock chambers 121, 122. In the depicted embodiment, the metrology module 126 is used as a pass-through module. In other embodiments (not shown), the metrology module 126 may be a peripheral unit of the input/output module 102. The processing system having a measuring tool is disclosed, for example, in commonly assigned U.S. Pat. No. 6,150,664, issued Nov. 21, 2000, which is incorporated by reference in its entirety.

In one exemplary embodiment, the system 100 comprises the platform 101 including the DPS® II module 110, DPS® II HT modules 112 and 114, AXIOM™ module 116, load-lock chambers 121 and 122, and transfer chamber 128 and the input/output module 102 including the metrology module 126 comprising the measuring tool 104, FOUPs 106 and 107, and substrate robots 108 and 120. It is contemplated that other suitable etching and ashing modules available from other manufacturers may be utilized.

The factory interface 124 is generally an atmospheric pressure interface used to transfer the cassettes with pre-processed and post-processed wafers disposed in the FOUPs 106, 107 between various processing systems and manufacturing regions of the semiconductor fab. Generally, the factory interface 124 comprises a substrate-handling device 136 and a track 138. In operation, the substrate-handling device 136 travels along the track 138 to transport the FOUPs between cluster tools or other processing equipment.

The system controller 140 is coupled to and controls modules and apparatus of the integrated processing system 100. The system controller 140 controls all aspects of operation of the system 100 using a direct control of modules and apparatus of the system 100 or, alternatively, by controlling the computers (or controllers) associated with these modules and apparatus. In operation, the system controller 140 enables data collection and feedback from the respective modules (e.g., metrology module 126) and apparatus that optimizes performance of the system 100.

The system controller 140 generally comprises a central processing unit (CPU) 142, a memory 144, and support circuits 146. The CPU 142 may be one of any form of a general purpose computer processor that can be used in an industrial setting. The support circuits 146 are conventionally coupled to the CPU 142 and may comprise cache, clock circuits, input/output subsystems, power supplies, and the like. The software routines, when executed by the CPU 142, transform the CPU into a specific purpose computer (controller) 140. The software routines may also be stored and/or executed by a second controller (not shown) that is located remotely from the system 100.

Figure 2A:
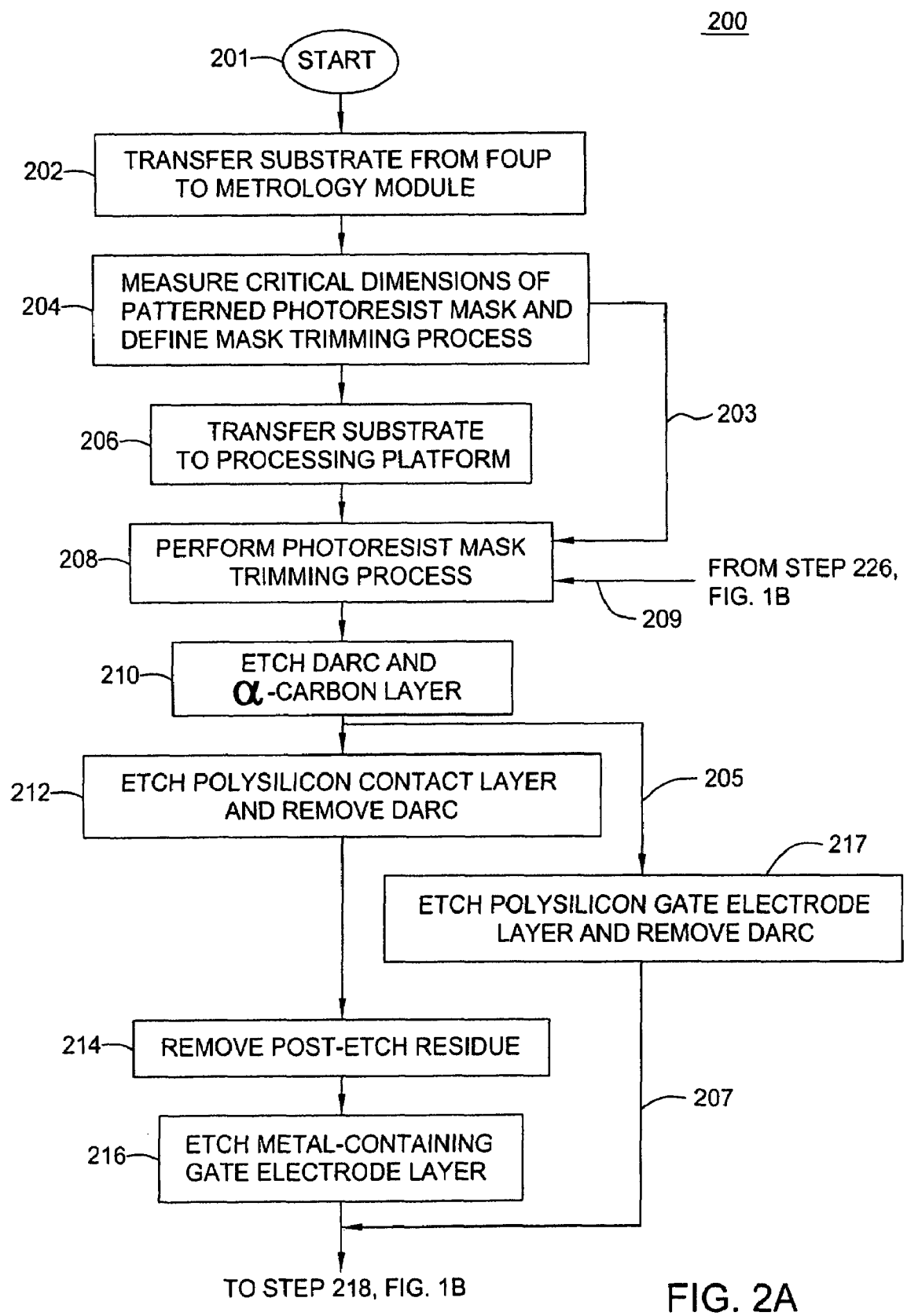
FIGS. 2A-2B, together, depict a flow diagram of a method of process integration in manufacture of a gate structure of a field effect transistor having a high-k gate dielectric in accordance with one embodiment of the present invention.
Figure 2B:
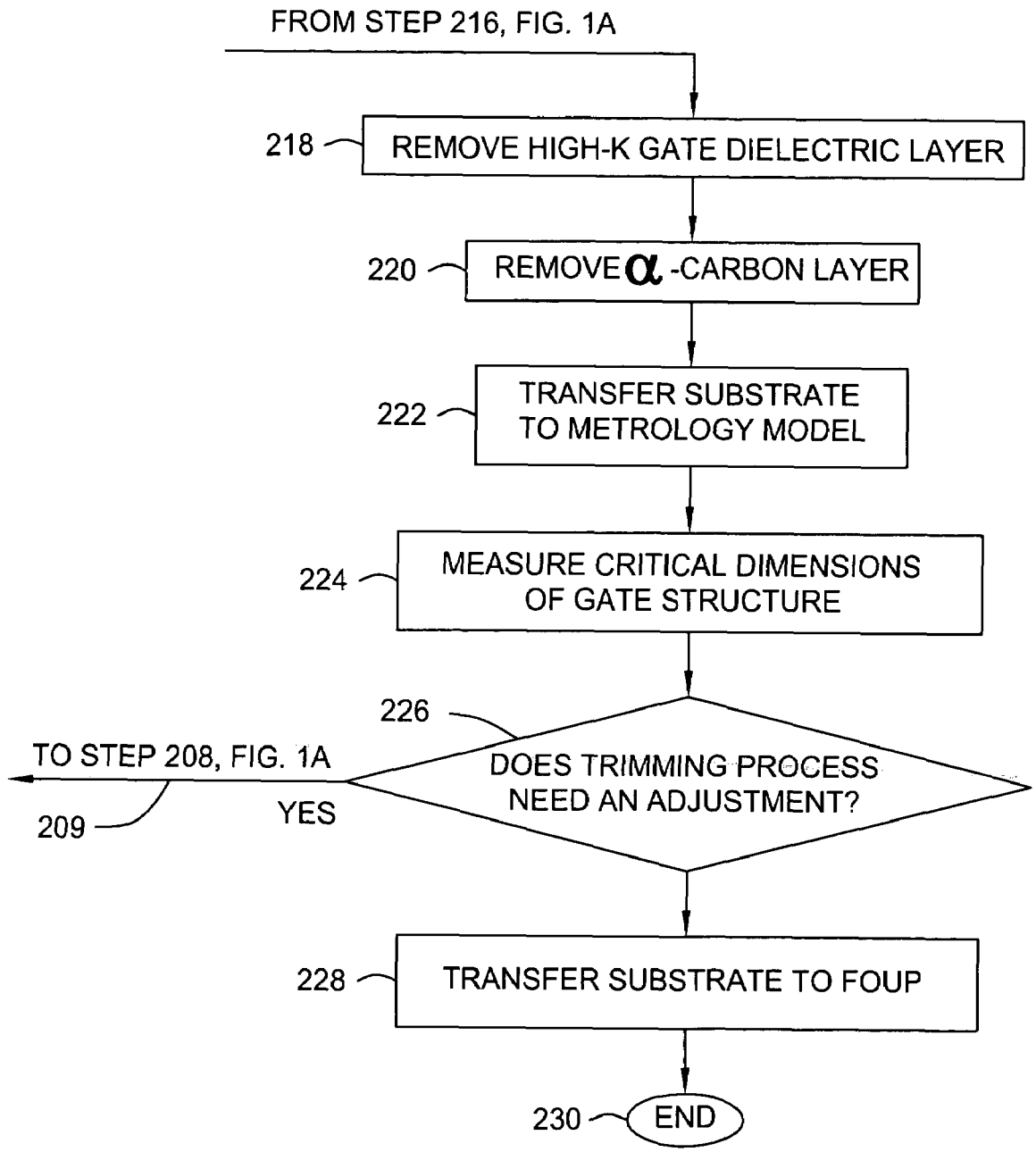

FIGS. 2A-2B depict a flow diagram of one embodiment of the inventive method for process integration in manufacture of a gate structure of a field effect transistor as a process 200. The process 200 illustratively includes the processing steps performed upon a substrate during fabrication of the gate structure of a CMOS field effect transistor.

FIGS. 3A-3J and 4A-4F depict series of schematic, cross-sectional views of a substrate showing the gate structure being fabricated using the process 200. The cross-sectional views in FIGS. 3A-3J and 4A-4F relate to individual processing steps that are used to fabricate the gate structure having a metal-containing gate electrode and a polysilicon gate electrode, respectively. To best understand the invention, the reader should simultaneously refer to FIGS. 2A-2B and FIGS. 3A-3J and 4A-4F. The images in FIGS. 3A-3J and 4A-4F are not depicted to scale and are simplified for illustrative purposes.

Figure 3A:
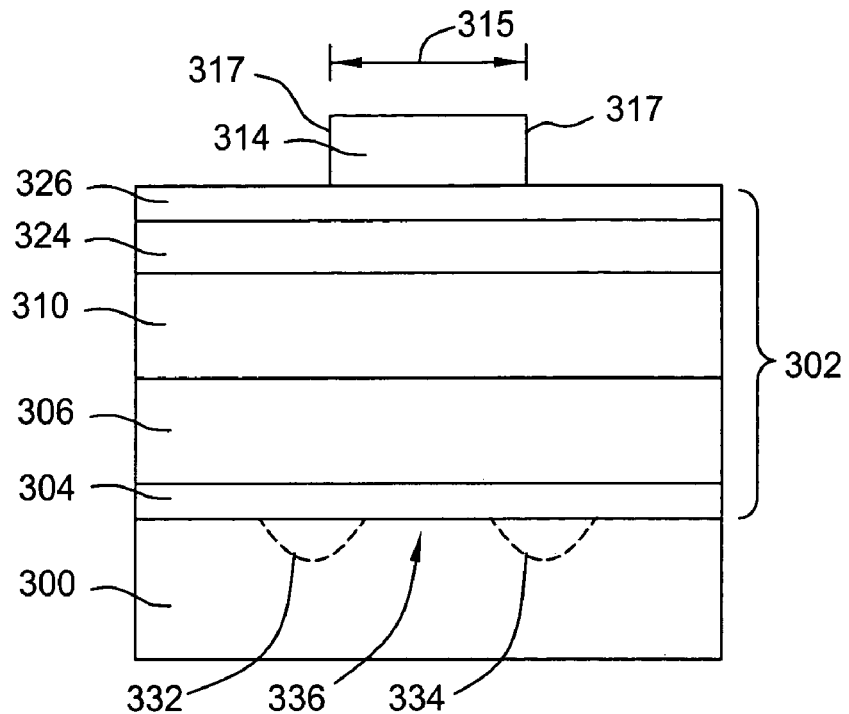
FIG. 3A-3J, together, depict a series of schematic, cross-sectional views of a substrate where a gate structure of the field effect transistor having a metal-containing gate electrode is fabricated using the processing system of FIG. 1 in accordance with the method of FIGS. 2A-2B.
Figure 4A:
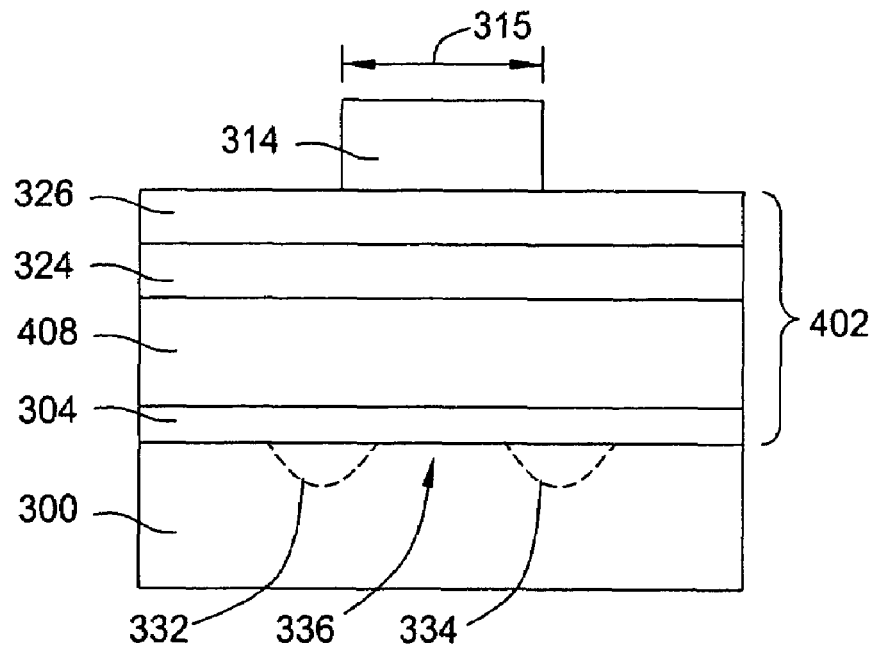
FIG. 4A-4F, together, depict a series of schematic, cross-sectional views of a substrate where a gate structure of the field effect transistor having a polysilicon gate electrode is fabricated using the processing system of FIG. 1 in accordance with the method of FIGS. 2A-2B.

The process 200 starts at step 201 and proceeds to step 202, where a substrate 300 (e.g., silicon (Si) wafer, and the like) is transferred from a FOUP (e.g., FOUP 106) to the metrology module 126 using, e.g., the substrate robot 108. The substrate 300 generally comprises a patterned photoresist mask 314 and a plurality of film stacks 302 (one film stack 302 is shown in FIG. 3A) or film stacks 402 (one film stack 402 is shown in FIG. 4A) of the gate structures being fabricated. The film stacks 302 and 402 correspond to the CMOS transistors having a metal-containing gate electrode and a polysilicon gate electrode, respectively.

The patterned photoresist mask 314 defines the location of the gate structure to be fabricated and is disposed above regions 332 and 334 (both regions are depicted with broken lines) where the sources and drains of the transistors will be formed using an ion implantation process after fabrication of the gate structure is completed. The source and drain regions 332, 334 are separated by a channel region 336 in each of the transistors being manufactured.

The film stack 302 generally comprises a dielectric anti-reflective coating (DARC) 326, an α-carbon film 324, a contact layer 310, a gate electrode layer 306, and a gate dielectric layer 304.

The DARC 326 is used to control the reflection of light during a process of lithographic patterning the photoresist mask 314. Typically, the DARC 326 comprises silicon dioxide ($SiO_2$), silicon oxynitride (SiON), silicon nitride ($Si_3N_4$), and the like. The film 324 is illustratively formed from a high-temperature inorganic carbon material, referred to as α-carbon. The α-carbon material is available from Applied Materials, Inc. under the trade name Advanced Patterning Film (APF™) and disclosed in commonly assigned U.S. patent application Ser. No. 09/590,322, filed Jun. 8, 2000, which is herein incorporated by reference. The α-carbon film 324 may be further doped with nitrogen ($N_2$) to improve the etch selectivity of the α-carbon material versus other materials used in the film stack 302. In one illustrative embodiment, the α-carbon film 324 is formed to a thickness of about 1800

Angstroms. Stability of the α-carbon material at high temperatures (e.g., at 350-500 degrees Celsius and higher) is specifically beneficial at etching the high-k gate dielectric layer 304 (discussed in reference to step 218 below).

In some embodiments, the contact layer 310 is not needed. As such, the contact layer 310 is considered optional. When present, the contact layer 310 is typically formed from doped polysilicon (Si) to a thickness of about 500 to 2000 Angstroms. In one exemplary embodiment, the film stack 302 comprises the polysilicon contact layer 310 having a thickness of about 1000 Angstroms. The gate electrode layer 306 may comprise at least one of a metal (e.g., titanium (Ti), tantalum (Ta), tungsten (W), and the like) and/or a metal-containing conductive compound, such as titanium nitride (TiN), tantalum nitride (TaN), tungsten nitride (WN), and the like. In one exemplary embodiment, the gate electrode layer 306 is formed from titanium nitride (TiN) to a thickness of about 50 to 300 Angstroms. The gate dielectric layer 304 comprises at least one high-k material, including hafnium dioxide ($HfO_2$), hafnium silicate ($HfSiO_2$), hafnium silicon oxynitride (HfSiON), and the like, or a combination thereof. Herein, dielectric materials having a dielectric constant greater than 4.0 are referred to as high-k dielectric materials. In one exemplary embodiment, the gate dielectric layer 304 is formed from hafnium dioxide to a thickness of about 10 to 20 Angstroms.

The film stack 402 generally comprises the DARC 326, the α-carbon film 324, a gate electrode layer 408 formed from doped polysilicon to a thickness of about 500 to 6000 Angstroms, and the gate dielectric layer 304.

It should be understood that, in other embodiments, the film stacks 302, 304 may comprise layers formed from different materials and having different thicknesses. The layers may be formed using any conventional vacuum deposition technique, such as atomic layer deposition (ALD), physical vapor deposition (PVD), chemical vapor deposition (CVD), plasma enhanced CVD (PECVD), and the like. Fabrication of the film stacks 302, 402 may be performed using, e.g., semiconductor wafer processing systems available from Applied Materials, Inc.

At step 204, the substrate 300 is inspected at the metrology module 126 and dimensions of structures of the patterned mask 314 are measured using, e.g., the measuring tool 104. To perform the measurements, the measuring tool may use at least non-destructive optical measuring techniques, such as spectroscopy, interferometry, scatterometry, reflectometry, ellipsometry, and the like. The measured dimensions may include topographic dimensions, critical dimensions (CDs), thickness, profile angle, and the like. The term "critical dimensions" refers herein to the minimal widths of the mask 314. The measurements may be performed on each substrate of a batch of the substrates 300, as well as with pre-defined periodicity. In one embodiment, the measuring tool 104 performs measurements of a width 315 of the patterned mask 314 on each substrate 300. The measurements are typically performed in a plurality of regions of the substrate, such as a statistically significant number of the regions (e.g., 5 to 9 regions), and then averaged for such a substrate. The results of these measurements are used in the integrated semiconductor substrate processing system 100 to determine the recipe of a trimming process (discussed in reference to step 208 below), as illustrated in FIG. 2 using a link 203. Due to optical limitations of the lithographic patterning process, the photoresist mask 314 typically comprises structures, which are scaled-up images of the features to be etched in the underlying layers. As such, after the patterning process, the photoresist mask 314 should be trimmed to reduce widths 315 of such structures before the mask may be used as the etch mask. Methods of controlling dimensions of the etched features using the pre-trim measurements of the photoresist patterned masks are disclosed, for example, in commonly assigned U.S. patent application Ser. No. 10/428,145, filed May 1, 2003 and Ser. No. 10/666,317, filed Sep. 19, 2003, which are herein incorporated by reference.

At step 206, the substrate 300 is transferred from the metrology module 126 to the vacuum-tight processing platform 101. In one exemplary embodiment, the substrate 300 is positioned in the load-lock chamber 121 of the platform 101 using the substrate robot 108 and then, using the substrate robot 130 of the transfer chamber 128, the substrate 300 is transferred to the DPS® II module 110.

Figure 3B:
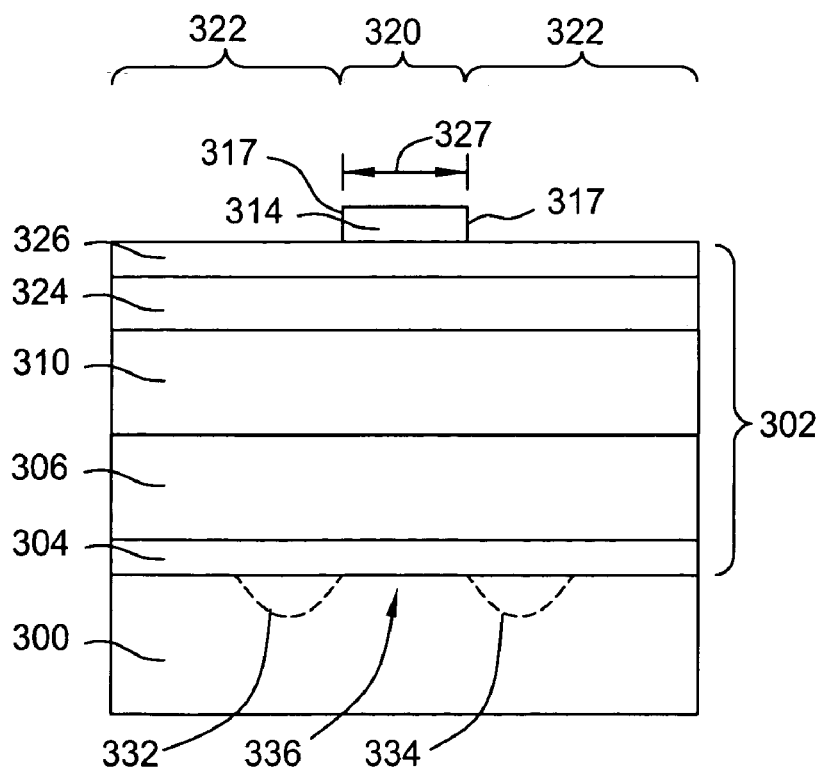
Figure 4B:
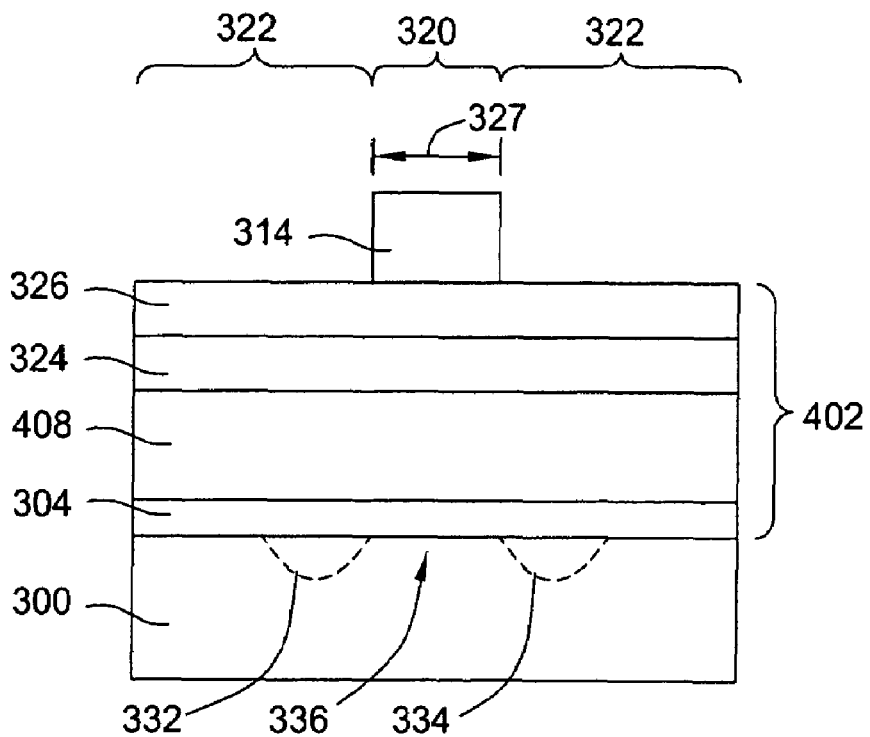

At step 208, the patterned photoresist mask 314 is trimmed to reduce the width 315 to a pre-determined width 327 (FIGS. 3B, 4B). A trimming process is generally an isotropic plasma etch process. In one embodiment, the trimming process uses a gas (or gas mixture) comprising hydrogen bromide (HBr), oxygen ($O_2$), and a diluent gas, such argon (Ar), neon (Ne), and the like. Herein, the terms "gas" and "gas mixture" are used interchangeably. After trimming, a height of the mask 314 also decreases, as illustratively shown in FIGS. 3B, 4B. In some applications there is no need in reducing the width 315 and, as such, step 208 is considered optional.

In one illustrative embodiment, the patterned photoresist mask 314 is trimmed using the DPS® II etch module by providing hydrogen bromide (HBr) at a rate of 2 to 200 sccm, oxygen ($O_2$) at a rate of 5 to 100 sccm (corresponds to a $HBr:O_2$ flow ratio ranging from 1:10 to 10:1), argon (Ar) at a rate of 10 to 200 sccm, applying power to an inductively coupled antenna between 200 to 1000 W, applying a cathode bias power between 0 and 300 W, and maintaining a wafer temperature between 0 and 80 degrees Celsius at a pressure in the process chamber between 2 and 30 mTorr. One trimming process provides HBr at a rate of 60 sccm, $O_2$ at a rate of 28 sccm (i.e., a $HBr:O_2$ flow ratio of about 2:1), Ar at a rate of 20 sccm, applies 500 W of power to the antenna, 20 W of a bias power, maintains a wafer temperature of 50 degrees Celsius, and a pressure of 4 mTorr. Such a process provides etch selectivity for photoresist (mask 314) over silicon oxynitride (DARC 326) of at least 10:1 and may be used to reduce the width 315 of the patterned photoresist mask 314 from 100-150 nm to about 50 nm or less (width 327).

Figure 3C:
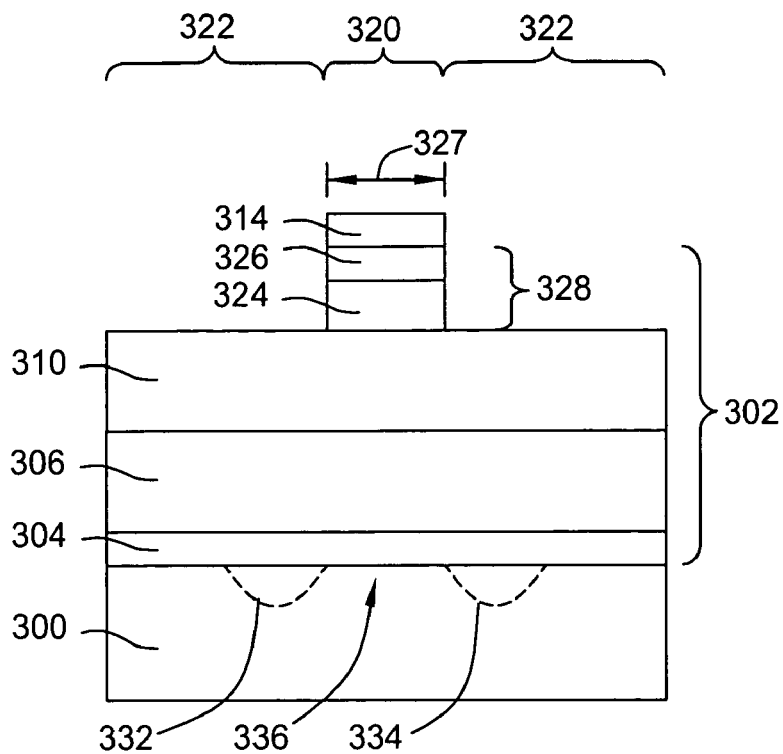
Figure 4C:
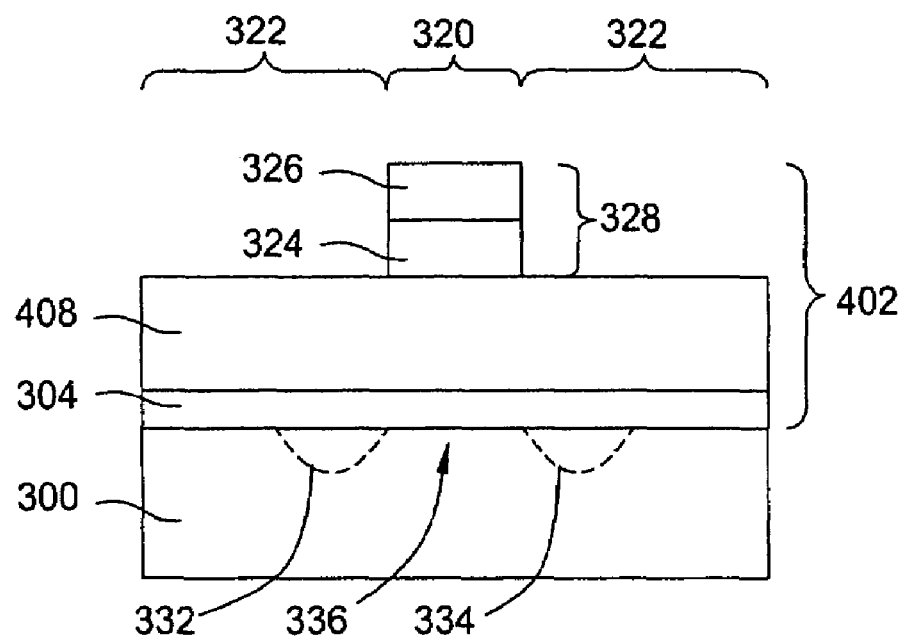

At step 210, the DARC 326 and α-carbon film 324 are in-situ etched and removed in regions 322 adjacent to the trimmed mask 314 (FIGS. 3C, 4C). Step 210 uses the trimmed photoresist mask 314 as an etch mask. The remaining portions of the (DARC) 326 and α-carbon film 324, together, form a hard etch mask 328 disposed in region 320 on the contact layer 310 of the film stack 302 (FIG. 3C) or the polysilicon layer 408 of the film stack 402 (FIG. 4C), respectively. In one exemplary embodiment, step 210 also strips the patterned mask 314. In such an embodiment, step 210 comprises two periods. During a first period, the DARC 326 is etched using a plasma comprising a gas mixture of carbon tetrafluoride ($CF_4$) and argon (Ar). During a second period, the α-carbon film 324 is etched and photoresist patterned mask 314 is consumed (stripped) using a plasma comprising a gas mixture of hydrogen bromide (HBr), oxygen ($O_2$), and argon (Ar).

In one illustrative embodiment, during the first period, the DARC 326 comprising silicon oxynitride (SiON) is etched using the DPS® II etch module by providing tetrafluoride ($CF_4$) at a rate of 20 to 200 sccm, argon (Ar) at a rate of 20 to 200 sccm (i.e., a $CF_4:Ar$ flow ratio ranging from 1:10 to 10:1), applying power to an inductively coupled antenna between 200 to 1500 W, applying a cathode bias power between 20 and 150 W, and maintaining a wafer temperature between 50 and 200 degrees Celsius at a pressure in the process chamber between 2 and 20 mTorr. One process recipe provides $CF_4$ at a rate of 120 sccm, Ar at a rate of 120 sccm (i.e., a $CF_4$:Ar flow ratio of about 1:1), applies 360 W of power to the antenna, 60 W of a bias power, maintains a wafer temperature of 80 degrees Celsius, and a pressure of 4 mTorr. The process provides etch selectivity for silicon oxynitride (DARC 326) over photoresist (mask 314) of at least 3:1.

During the second period, the α-carbon film 324 is etched by providing hydrogen bromide (HBr) at a rate of 20 to 200 sccm, oxygen ($O_2$) at a rate of 10 to 40 sccm (i.e., a HBr:$O_2$ flow ratio ranging from 1:2 to 20:1), and argon (Ar) at a rate of 20 to 200 sccm, applying power to an inductively coupled antenna between 200 to 1500 W, applying a cathode bias power between 50 and 200 W, and maintaining a wafer temperature between 50 and 200 degrees Celsius at a pressure in the process chamber between 2 and 20 mTorr. One process recipe provides HBr at a rate of 60 sccm, $O_2$ at a rate of 26 sccm, (i.e., a HBr:$O_2$ flow ratio of about 2.3:1), and Ar at a rate of 60 sccm, applies 600 W of power to the antenna, 60 W of a bias power, maintains a wafer temperature of 80 degrees Celsius, and a pressure of 4 mTorr. The process provides etch selectivity for α-carbon film 324 over photoresist (mask 314) of at least 2:1, as well as etch selectivity for photoresist over polysilicon (layers 310 and 408) of about 100:1.

Upon completion of the etch process, the substrate 300 is transferred from the DPS® II module 110 to one of the DPS® II HT modules (module 112 or 114). In the DPS® II HT module, the substrate 300 comprising the film stacks 302 undergoes steps 212, 214, 216, and 218. The substrate 300 comprising the film stacks 402 skips steps 212, 214, and 216 and undergoes steps 217 and 218, as shown in FIG. 1 using links 205 and 207.

Figure 3D:
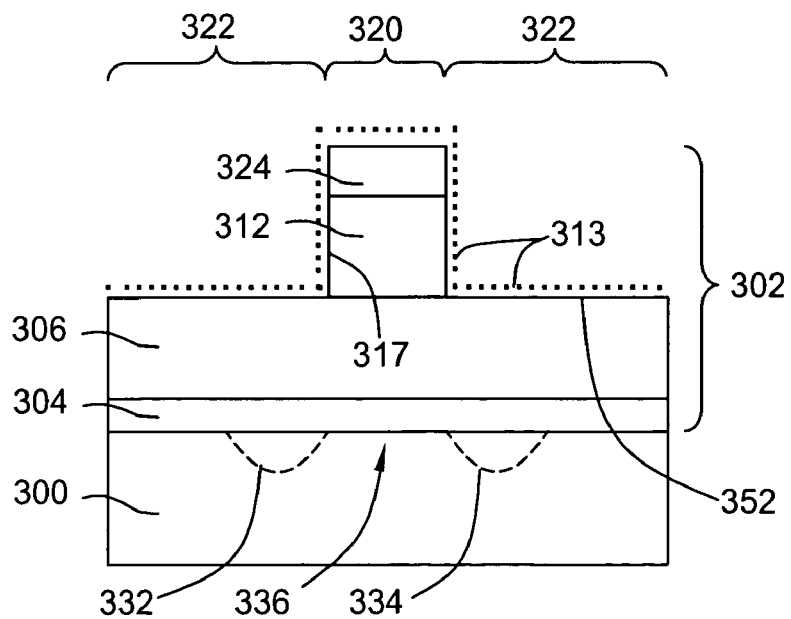

At step 212, the contact layer 310 is etched and removed in regions 322 (FIG. 3D). A remaining portion of the contact layer 310 forms an upper contact 312 (e.g., polysilicon upper contact). Step 210 uses the DARC 326 as a consumable etch mask and the gate electrode layer 306 (e.g., titanium nitride) as an etch stop layer. Upon completion of step 212, the DARC 326 is removed. In one embodiment, step 212 performs a plasma etch process comprising a main etch period, a soft landing period, and an overetch period. Such a process minimizes an amount of post-etch residue 313 (shown using dotted lines). In an alternative embodiment, to remove the contact layer 310 in the regions 322, step 212 uses only the plasma etch process of the main etch period. Therefore, the soft landing and over etch periods are considered optional.

In one embodiment, the main etch period of step 212 removes, at a high etch rate, approximately 30 to 70 percent of the exposed portion of the polysilicon contact layer 310, and the soft landing etch period removes the remaining exposed portion of the polysilicon contact layer 310. In this embodiment, the overetch period removes any traces of the polysilicon along with a small portion of the exposed gate electrode layer 306. A duration of each of the etch periods may be determined using control of the process time, plasma emissions at a particular wavelength, laser interferometry, and other end point techniques.

To etch the polysilicon contact layer 310, the main etch period of step 212 may use a gas (or gas mixture) comprising at least one of chlorine ($Cl_2$), hydrogen bromide (HBr), a fluorine-containing gas (e.g., carbon tetrafluoride ($CF_4$), nitrogen trifluoride ($NF_3$), and the like), as well as at least one optional gas, such as nitrogen ($N_2$), a mixture of helium (He) and oxygen ($O_2$), or He—$O_2$, and an inert gas or gases (e.g., argon (Ar), neon (Ne), and the like), or a combination thereof.

In one exemplary embodiment, during the main etch period of step 212, the contact layer 310 comprising polysilicon is etched using the DPS® II HT module by providing hydrogen bromide (HBr) at a flow rate of 20 to 300 sccm, chlorine ($Cl_2$) at a flow rate of 20 to 300 sccm (i.e., a HBr:$Cl_2$ flow ratio ranging from 1:15 to 15:1), carbon tetrafluoride ($CF_4$) at a flow rate of 0 to 100 sccm (i.e., a HBr:$CF_4$ flow ratio ranging from 1:5 to 1:0), oxygen ($O_2$) at a flow rate of 0 to 200 sccm, applying power to an inductively coupled antenna between 200 and 3000 W, applying a cathode bias power between 0 and 300 W, and maintaining a wafer pedestal temperature between 20 and 80 degrees Celsius and a chamber pressure between 2 and 100 mTorr. One process recipe provides HBr at a flow rate of 150 sccm, $Cl_2$ at a flow rate of 150 sccm (i.e., a HBr:$Cl_2$ flow ratio of about 1:1), $CF_4$ at a flow rate of 0 sccm (i.e., a HBr:$CF_4$ flow ratio of about 1:0), $O_2$ at a flow rate of 20 sccm, applies 400 W to the inductively coupled antenna, 100 W of cathode bias power, maintains a wafer pedestal temperature of 65 degrees Celsius and a chamber pressure of 8 mTorr.

The soft landing period of step 212 etches and removes the bulk of the polysilicon contact layer 310 remaining after the main etch period. During the soft landing period, the etch recipe is similar to that of the main etch period except that the flow of the fluorine-containing gas (i.e., carbon tetrafluoride) is selectively adjusted. In one exemplary embodiment, during the soft landing period, the flow of the fluorine-containing gas is terminated.

The overetch period of step 212 removes the traces of the contact layer 310 that may remain after the main etch and soft landing periods, respectively. In a further embodiment, the overetch period may remove (not shown) in the regions 322 a small portion of the gate electrode layer 306. During the overetch period, the etch recipe is similar to that of the main etch period except that a flow the fluorine-containing gas and a flow of chlorine are selectively adjusted. In one exemplary embodiment, during the overetch period, the flow of the fluorine-containing gas and the flow of chlorine are terminated. Such a process provides etch selectivity for polysilicon (layer 310) over titanium nitride (layer 306) of at least 100:1, as well as etch selectivity for polysilicon over silicon oxynitride (DARC 326) of about 80:1.

Step 212 produces post-etch residue 313 that rests on a surface 352 of the gate electrode layer 306, the α-carbon film 324, sidewalls 317 of the upper contact 312, and elsewhere on the substrate 300. The post-etch residue 313 (e.g., $SiO_x$/$TiO_x$ residue, where x is integer) is resistant to etchants that may be used to etch the metal-containing gate electrode layer 306 (discussed in reference to step 216 below) and, as such, the residue should be removed from the surface 352. Presence of the post-etch residue 313 on sidewalls 317 is generally not detrimental to fabricating the gate structure. During etching the gate electrode layer 306, the post-etch residue 313 may be used as a sacrificial passivation layer that protects the sidewalls 317 from undercutting. Remaining traces of the post-etch residue 313 may be removed from the sidewalls 317, for example, after the gate dielectric layer 304 has been etched (discussed in reference to step 218 below).

Figure 3E:
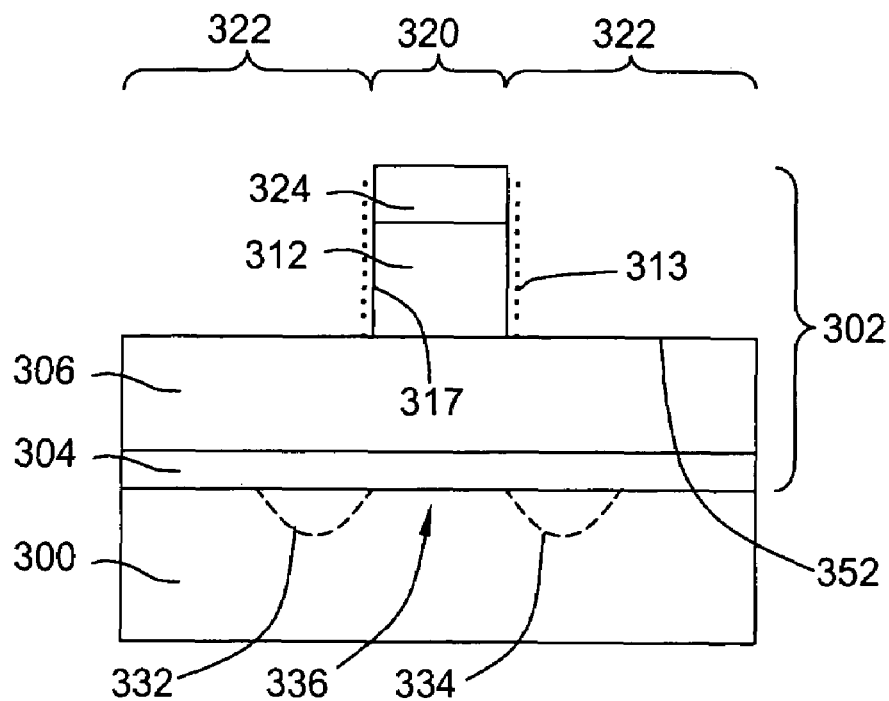

At step 214, the post-etch residue 313 is removed from the surface 352 of the gate electrode layer 306 (FIG. 3E). Contemporaneously, step 214 removes the residue 313 from a top surface of the α-carbon film 324, as well as thins or removes the residue 313 on the sidewalls 317 of the upper contact 312.

In one embodiment, step 214 uses a predominantly physical plasma etch process (i.e., sputter etch). During removal of the post-etch residue 313, the sputter etch process provides high etch directionality, thus protecting the sidewalls 317 from erosion and minimizing sources of chemical contamination of the processing chamber. The sputter etch process may use an inert gas (e.g., argon (Ar), neon (Ne), and the like or a mixture thereof), as well as a mixture of the inert gas with an optional chemical etchant (e.g., chlorine, hydrogen bromide, and the like) to remove the post-etch residue 313. During step 214, an endpoint may be determined using control of the process time, monitoring plasma emissions at a particular wavelength, and other end point techniques.

Figure 3F:
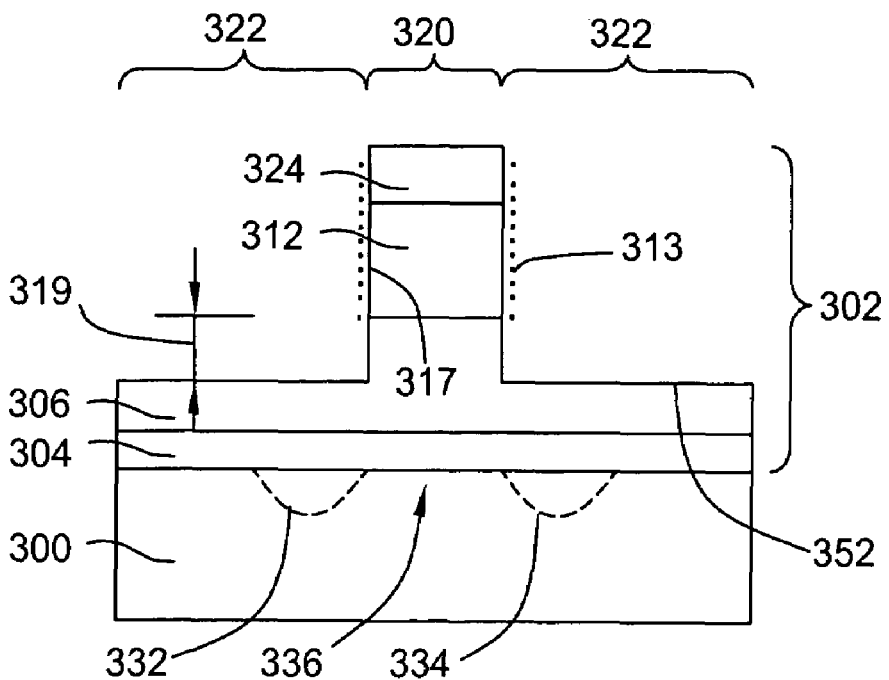

In one alternative embodiment depicted in FIG. 3F, the physical plasma etch process of step 214 may continue until the gate electrode layer 306 is removed (i.e., sputter etched) in the regions 322 to a pre-determined depth 319. In this embodiment, step 107 may be considered as a soft landing etch period of step 216 (discussed below with reference to FIGS. 3G-3H).

In one exemplary embodiment, the post-etch residue 313 is removed using the DPS® II HT module by providing argon (Ar) at a flow rate of about 20 to 400 sccm, hydrogen bromide (HBr) at a flow rate of about 0 to 400 sccm (i.e., a Ar:HBr flow ratio ranging from 1:20 to 1:0), applying power to an inductively coupled antenna between about 200 and 3000 W, applying a cathode bias power between about 0 and 300 W, and maintaining a wafer pedestal temperature between about 20 and 80 degrees Celsius and a chamber pressure between about 2 and 100 mTorr. One process recipe provides Ar at a flow rate of 200 sccm, HBr at a flow rate of 30 sccm, applies 1000 W to the inductively coupled antenna, applies 100 W of cathode bias power, maintains a wafer pedestal temperature of 65 degrees Celsius and a chamber pressure of 4 mTorr.

Figure 3G:
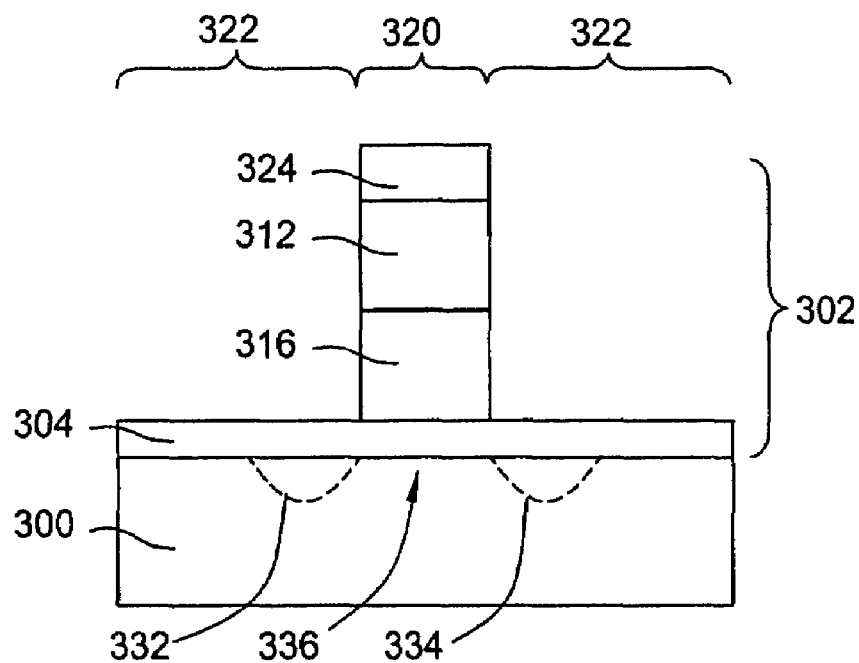
Figure 3H:
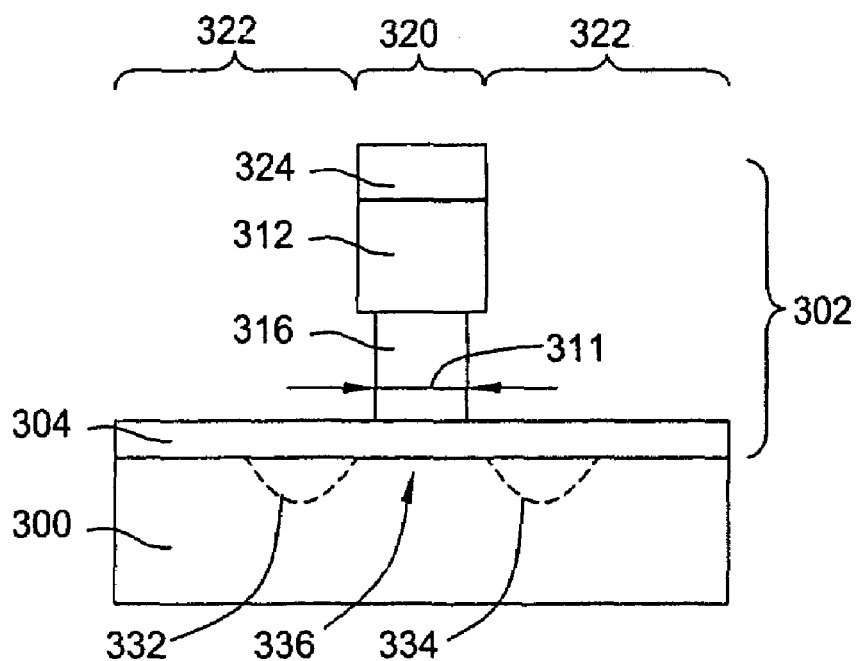

At step 216, the gate electrode layer 306 is etched and removed in the regions 322 (FIGS. 3G, 3H). A remaining portion of the gate electrode layer 306 forms a gate electrode 316 (e.g., titanium nitride gate electrode). During step 216, the α-carbon film 324 is used as an etch mask and the gate dielectric layer 304 is used as an etch stop layer. In one embodiment, step 216 performs a plasma etch process comprising a soft landing period, an overetch period, and an optional notching period. In an alternative embodiment, to remove the gate electrode layer 306 in the regions 322, step 216 uses only the etch process of the soft landing period.

In one embodiment, the soft landing period of step 216 removes, at a high etch rate, approximately 30 to 90 percent of the exposed portion of the gate electrode layer 306, while the overetch period removes the remaining exposed portion of the layer 306 (FIG. 3G). Further, the optional notching period of step 216 may notch the gate electrode 216 to a pre-determined width 311 (FIG. 3H). In one embodiment, the notching period is performed after the overetch period. Alternatively (not shown), the overetch period may be performed after the period 216c. A duration of each of the periods of step 216 may be determined using control of the process time, plasma emissions at a particular wavelength, laser interferometry, and other end point techniques. In one embodiment, the etch periods of step 216 use the same etching chemistry and the same process parameters except that the cathode bias power may selectively be adjusted for each respective period.

To etch the gate electrode layer 306, the etching chemistry comprises a gas mixture that includes at least one bromine-containing gas (e.g., hydrogen bromide (HBr), bromine (Br$_2$), and the like). The gas mixture may further include at least one optional gas, such as chlorine (Cl$_2$), oxygen (O$_2$), nitrogen (N$_2$), a mixture of helium (He) and oxygen (O$_2$), or He—O$_2$, and an inert gas or gases (e.g., argon (Ar), neon (Ne), helium (He), and the like), or a combination thereof.

Such etching chemistry facilitates high etch selectivity for a material of the metal-containing gate electrode layer 306 over the material of the gate dielectric layer 304 (e.g., high-k dielectric materials such as HfO$_2$, HfSiO$_2$, and HfSiON, and the like). Specifically, the process of step 216 provides etch selectivity for Ti, Ta, TaN over HfO$_2$ of at least about 100:1.

During step 216, directionality of the etch process may be controlled using the cathode (i.e., substrate pedestal) bias power. Specifically, the directionality of etching the gate electrode layer 206 decreases when step 216 applies low or no cathode power. Generally, during the soft landing period, step 216 applies a greater amount of the cathode power than during the over etch period or notching period. During the optional notching period 216c, step 216 typically applies no cathode power to facilitate lateral etching (i.e., notching) of the gate electrode 316 (FIG. 3H). When the gate electrode 316 is notched, due to high selectivity of the etch process to the material of the gate dielectric layer 304, the layer 304 acts as an etch stop layer. The gate electrode 316 may be notched to a pre-determined width 311 using, for example, control of the process time.

In one exemplary embodiment, during the soft landing period of step 216, the gate electrode layer 306 comprising titanium nitride (TiN) is etched using the DPS® II HT module by providing hydrogen bromide (HBr) at a flow rate of 50 to 400 sccm, chlorine (Cl$_2$) at a flow rate of 0 to 400 sccm (i.e., a HBr:Cl$_2$ flow ratio ranging from 1:8 to 1:0), helium (He) at a flow rate of 0 to 400 sccm, applying power to an inductively coupled antenna between 300 and 3000 W, applying a cathode bias power between 0 and 300 W, and maintaining a wafer pedestal temperature between 20 and 90 degrees Celsius and a chamber pressure between 4 and 80 mTorr. One process recipe provides HBr at a flow rate of 400 sccm, He at a flow rate of 200 sccm, applies 1000 W to the inductively coupled antenna, 10 W of cathode bias power, and maintains a wafer pedestal temperature of 65 degrees Celsius and a chamber pressure of 10 mTorr. Such an etch process provides etch selectivity for titanium nitride over hafnium dioxide (layer 304) of about 100:1. During the notching period 216c, a lateral etch rate of titanium nitride is typically about 10 to 100 Angstroms/min.

In this exemplary embodiment, the overetch period and notching period of step 216 use the same process recipe parameters as the soft landing period except that the cathode power is selectively adjusted to facilitate overetch and notching, respectively. In one embodiment, the overetch period applies the cathode bias power of about 0 to 300 W (one exemplary process provides 10 W), and the notching period applies no cathode bias power. In addition to high etch selectivity to the material of the gate dielectric layer 304, step 216 provides high etch selectivity to polysilicon and, as such, maintains dimensional accuracy of the upper contact 312.

Figure 4D:
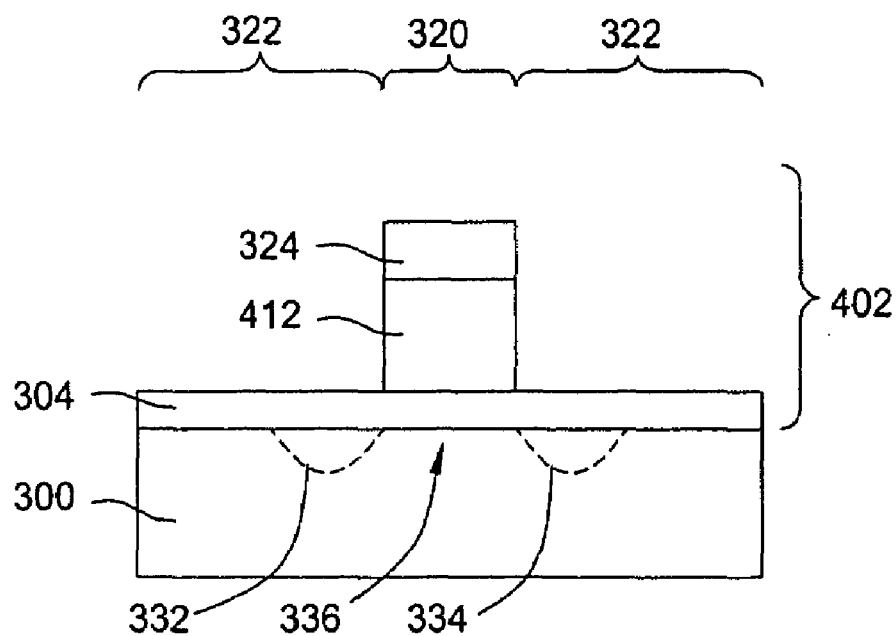

At step 217, the polysilicon gate electrode layer 408 of the film stack 402 is etched and removed in regions 322 (FIG. 4D). A remaining portion of the layer 408 forms a gate electrode 412 (e.g., polysilicon gate electrode). Step 210 uses the DARC 326 as a consumable etch mask and the gate dielectric layer 304 (e.g., hafnium dioxide) as an etch stop layer. In one exemplary embodiment, steps 217 and 212 may use similar process recipes.

Figure 3I:
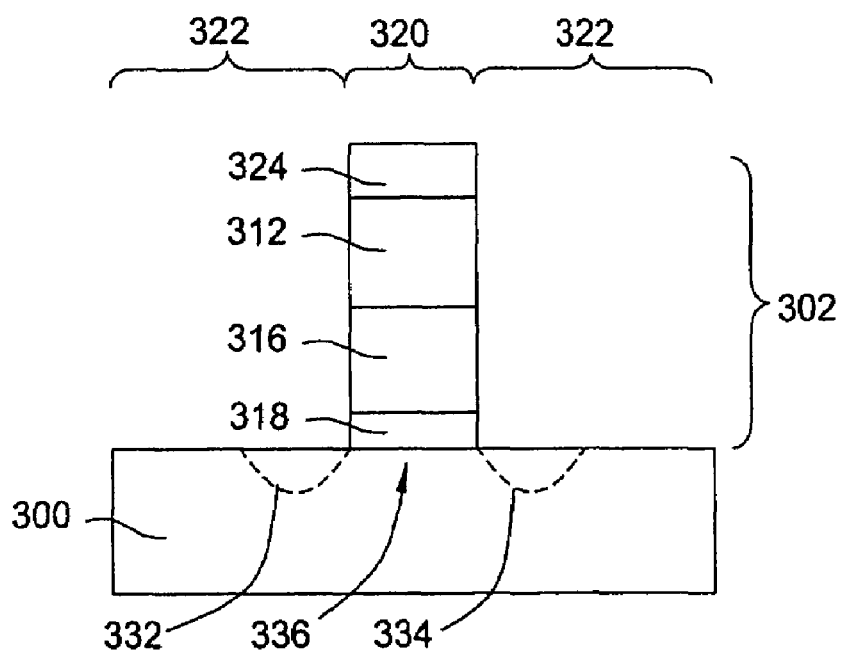
Figure 3J:
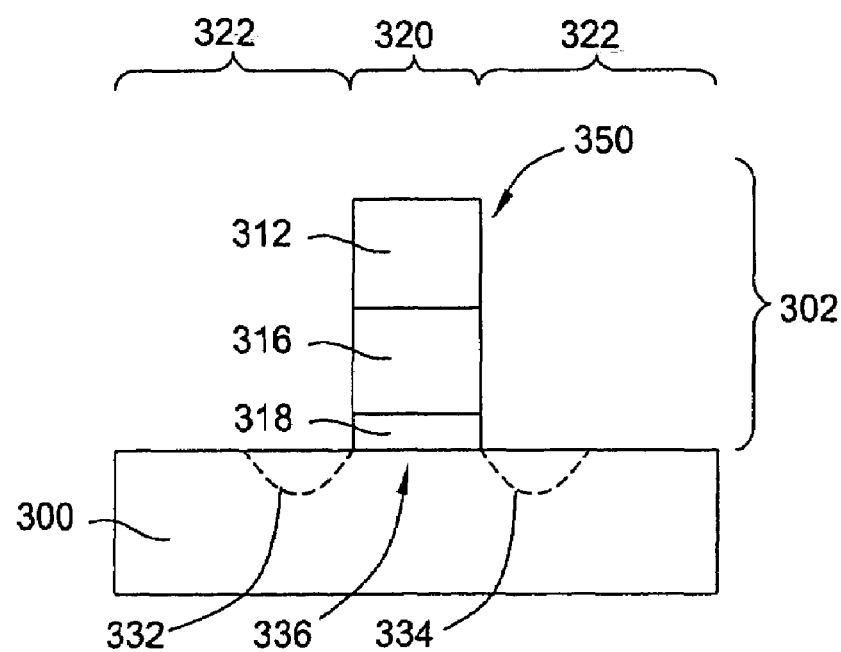
Figure 4E:
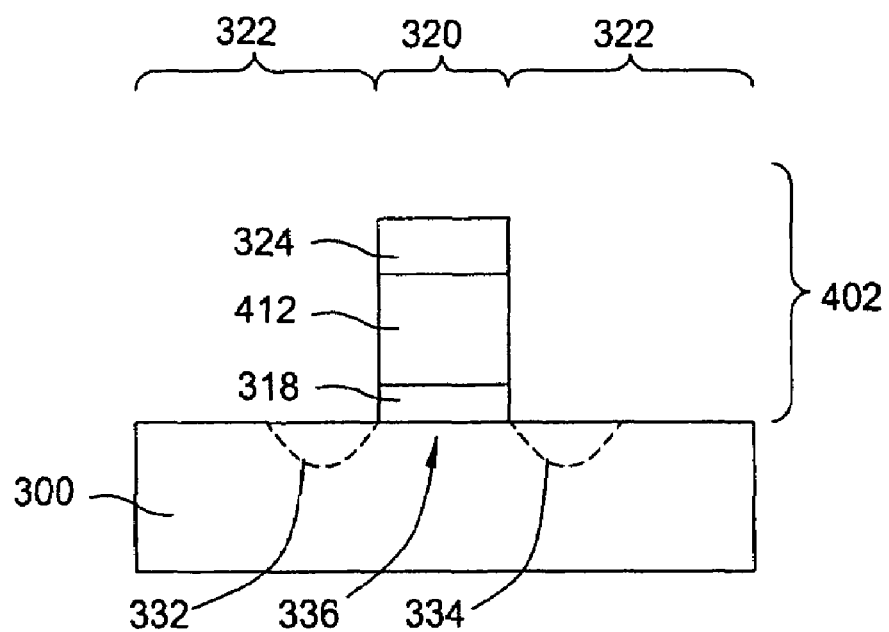
Figure 4F:
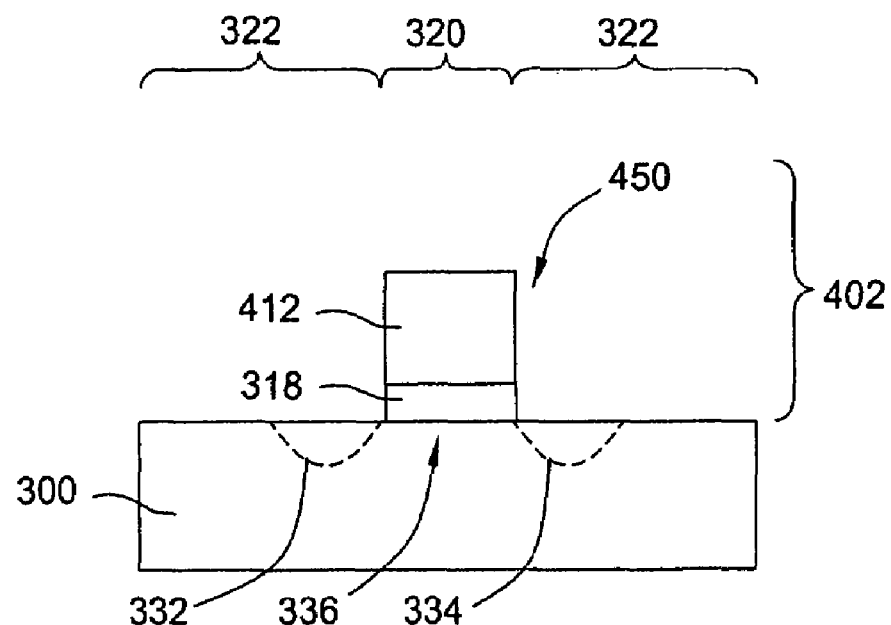

At step 218, the gate dielectric layer 304 is etched and removed in the regions 322 (FIGS. 3I, 4E). A remaining portion of the gate dielectric layer 304 forms a gate dielectric 318 (e.g., high-k gate dielectric) for the gate structure of the CMOS transistor being fabricated. During step 218, the α-carbon film 324 is used as an etch mask and the substrate 300 is used as an etch stop layer. In one embodiment, step 218 performs a plasma etch process that uses a gas mixture comprising a halogen gas (e.g., chlorine ($Cl_2$), hydrogen chloride (HCl), and the like) and a reducing gas (e.g., carbon monoxide (CO), and the like)

In one exemplary embodiment, the gate dielectric layer 304 comprising hafnium dioxide ($HfO_2$) is etched using the DPS® II HT module by providing by providing chlorine ($Cl_2$) at a flow rate of 2 to 200 sccm, carbon monoxide (CO) at a flow rate of 2 to 200 sccm (corresponds to a $Cl_2$:CO flow ratio ranging from 1:5 to 5:1), applying power to an inductively coupled antenna between 200 and 3000 W, applying a cathode bias power between 0 and 300 W, and maintaining a wafer pedestal temperature between 200 and 350 degrees Celsius and a chamber pressure between 2 and 100 mTorr. One process recipe provides $Cl_2$ at a flow rate of 40 sccm, CO at a flow rate of 40 sccm (i.e., a $Cl_2$:CO flow ratio of about 1:1), applies 1100 W to the inductively coupled antenna, 20 W of cathode bias power, and maintains a wafer pedestal temperature of 350 degrees Celsius and a chamber pressure of 4 mTorr. Upon completion of step 218, the substrate 300 is transferred from the DPS® II HT module to the AXIOM™ plasma ashing module for performing step 220.

At step 220, the α-carbon film 324 is removed (or stripped) from the upper contact 312 of the film stack 302 (FIG. 3J) or from the gate electrode of the film stack 402 (FIG. 4F) thereby completing fabrication of gate structures 350 and 450, respectively. In one embodiment, step 220 provides hydrogen bromide at a rate 2 to 200 sccm and oxygen at a rate 5 to 100 sccm (i.e., a $HBr:O_2$ flow ratio ranging from 1:10 to 10:1), as well as argon (Ar) at a rate of 10 to 200 sccm. Further, step 109 applies source power of 200 to 1000 W and a bias power of 0 to 300 W, while maintains a wafer temperature at 0 to 80 degrees Celsius and a pressure in a reaction chamber at 2 to 30 mTorr. One process recipe provides HBr at a rate of 60 sccm and $O_2$ at a rate of 28 sccm (i.e., a $HBr:O_2$ flow ratio of about 2:1), Ar at a rate of 60 sccm, source power of 600 W, bias power of 100 W, a wafer temperature of 50 degrees Celsius, and a pressure of 4 Torr. Alternatively, a plasma comprising hydrogen ($H_2$) or a mixture of oxygen and a diluent gas such as argon (Ar) may be used to etch the α-carbon film 324.

At step 222, using the substrate robot 130, the substrate 300 is transferred to one of the load-lock chambers (e.g., load-lock chamber 122), and then a substrate robot of the input/output module 102 (e.g., substrate robot 120) transfers the substrate to the metrology module 126.

At step 224, the substrate 300 is inspected and dimensions of elements of the fabricated gate structures 350 and 450 are measured using the measuring tool 104. The measured dimensions may include topographic dimensions, CDs, thickness, profile angle, and the like. Similar to step 204, the measurements are typically performed in a plurality of regions of the substrate 300, such as a statistically significant number of the regions (e.g., 5 to 9 regions), and then averaged. In one embodiment, the measured dimensions include widths of the upper contact 312, metal-containing gate electrode 316, and high-k gate dielectric 318 (gate structure 350, FIG. 3J) or widths of the polysilicon gate electrode 412 and high-k gate dielectric 318 (gate structure 450, FIG. 4F). The results of these measurements are used in the integrated semiconductor substrate processing system 100 to determine selective adjustments for the trimming process for consecutive substrates, as illustrated in FIG. 1 using a link 209. In a further embodiment (not shown), the results of such measurements may be used for selective adjusting the processes of steps 210, 212, 214, 216, 218 and 220.

At step 226, the process 200 queries if the trimming process of step 208 needs an adjustment. If the query of step 106 is affirmatively answered, the process 200 calculates and communicates such an adjustment using link 209 to step 208. In one embodiment, the adjustment is calculated using the system controller 140 and then communicated to the DPS® II module 110. Methods for adjusting the trimming process are disclosed, for example, in the referred to above U.S. patent applications Ser. No. 10/428,145, filed May 1, 2003 and Ser. No. 10/666,317, filed Sep. 19, 2003. If the query of step 226 is negatively answered, the process 200 proceeds to step 228.

At step 228, the substrate 300 is transformed using, e.g., the substrate robot 120, from the metrology module 126 to a FOUP (e.g., FOUP 107) of the input/output module 102. At step 230, the process 200 ends.

Figure 5:
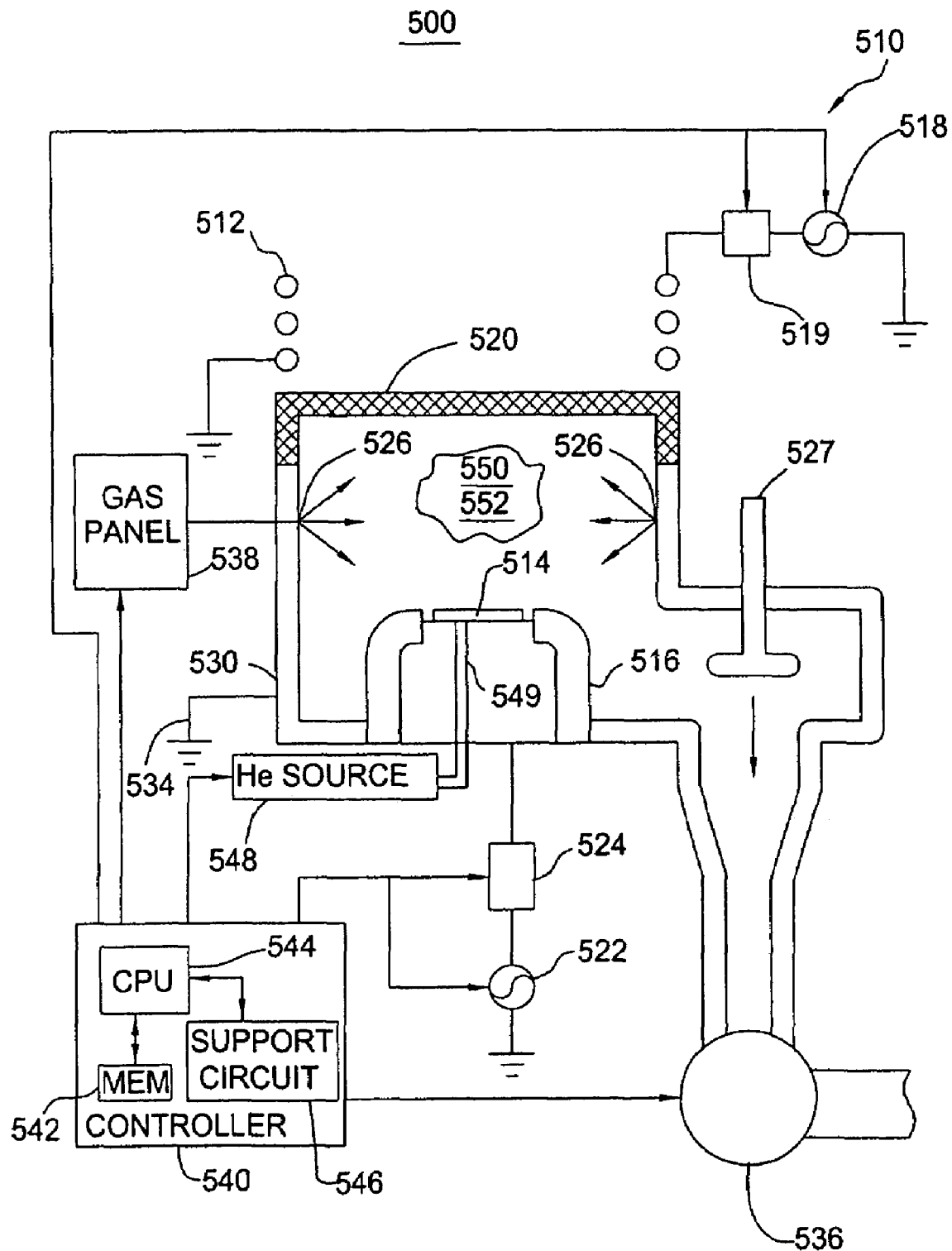
FIG. 5 depicts a schematic diagram of an exemplary plasma etch apparatus of the kind used in performing portions of the method of the present invention.

FIG. 5 depicts a schematic diagram of an exemplary DPS® II etch reactor 500 of the kind that may be used as a processing module of the integrated semiconductor substrate processing system 100. DPS® II and DPS® II HT reactors have the same configuration, however, the DPS® II HT reactor uses a high temperature substrate support pedestal that is capable, in operation, to maintain the substrate at a controlled temperature in a range from about 20 to 350 degrees Celsius.

The reactor 500 generally comprises a process chamber 510 having a wafer support pedestal 516 within a conductive body (wall) 530, and a controller 540. In one embodiment, the process chamber 510 has a substantially flat dielectric ceiling 520. Other modifications of the process chamber 510 may have other types of ceilings, e.g., a dome-shaped ceiling. Above the ceiling 520 is disposed an antenna comprising at least one inductive coil element 512 (two co-axial elements 512 are shown). The inductive coil element(s) 512 is(are) coupled, through a first matching network 519, to a plasma power source 518. The plasma source 518 is typically capable of producing at least 3000 W at a tunable frequency in a range from about 50 kHz to 13.56 MHz.

The support pedestal (cathode) 516 is coupled, through a second matching network 524, to a biasing power source 522. In one embodiment, the biasing source 522 is capable of providing at least 500 W at a frequency of approximately 13.56 MHz and may be capable of producing either continuous or pulsed power. In other embodiments, the source 522 may be a DC or pulsed DC power source. Typically, ground references of the plasma power source 518, biasing power source 522, and the chamber wall 530 are electrically coupled to a ground terminal 534 of the reactor 500.

In operation, a substrate (e.g., semiconductor wafer) 514 is placed on the support pedestal 516 and process gases are supplied from a gas panel 538 through entry ports 526 to form a gaseous mixture 550. The gaseous mixture 550 is ignited into a plasma 555 in the process chamber 510 by applying power from the plasma and bias sources 518 and 522 to the inductive coil element 512 and the cathode 516, respectively. The pressure within the interior of the process chamber 510 is controlled using a throttle valve 527 and a vacuum pump 536. The temperature of the wall 530 is controlled using liquid-containing conduits (not shown) that run through the wall.

In one embodiment, the temperature of the wafer 514 is controlled by stabilizing a temperature of the support pedestal 516. In this embodiment, helium gas from a gas source 548 is provided via a gas conduit 549 to channels formed in the pedestal surface under the wafer 514. The helium gas is used to facilitate heat transfer between the support pedestal 516 and the wafer 514. During the processing, the support pedestal 516 may selectively be heated (e.g., using a resistive heater (not shown) within the pedestal) to a pre-determined steady state temperature, and then the helium gas facilitates uniform heating of the wafer 514. Using such thermal control, the wafer 514 may be maintained at a temperature between about 20 to 350 degrees Celsius.

Those skilled in the art will understand that other forms of etch chambers may be used to practice the invention, including chambers with remote plasma sources, electron cyclotron resonance (ECR) plasma chambers, and the like.

The controller 540 comprises a central processing unit (CPU) 544, a memory 542, and support circuits 546 of the CPU 544 and facilitates control of the components and processes in the etch reactor 500. To facilitate control of the reactor 500, the controller 540 may be one of any form of general-purpose computer processor that can be used in an industrial setting for controlling various chambers and sub-processors. The memory 542, or computer-readable medium, may be of any form of digital storage, such as random access memory (RAM), read only memory (ROM), a floppy disk, a hard disk, and the like, either local or remote. The support circuits 546 generally include cache, clock circuits, input/output circuitry and subsystems, power supplies, and the like that are coupled, in a conventional manner, to the CPU 544 for supporting the CPU. The inventive method is generally stored in the memory 542 as a software routine. The software routine may also be stored and/or executed by a second CPU that is remotely located from the hardware being controlled by the CPU 544.

Figure 6:
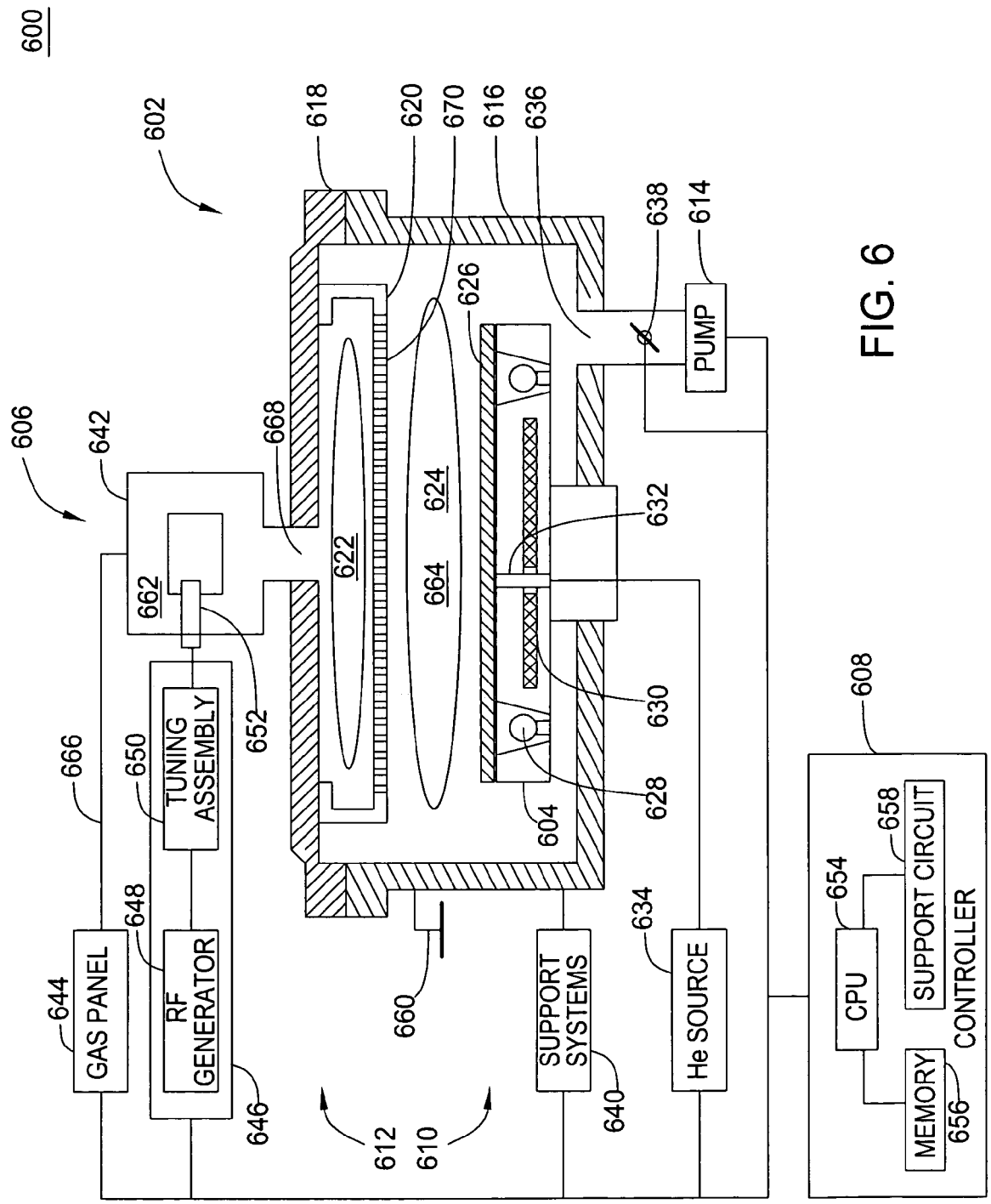
FIG. 6 depicts a schematic diagram of an exemplary plasma ashing apparatus of the kind used in performing portions of the method of the present invention.

FIG. 6 depicts a schematic diagram of an exemplary ashing reactor 600 of the kind that may be used as a processing module of the integrated semiconductor substrate processing system 100. An example of a suitable ashing reactor is described in detail in U.S. patent application Ser. No. 10/264,664, filed Oct. 4, 2002, which is herein incorporated by reference. Salient features of the reactor 600 are briefly described below.

The reactor 600 reactor comprises a process chamber 602, a remote plasma source 606, and a controller 608. The process chamber 602 generally is a vacuum vessel, which comprises a first portion 610 and a second portion 612. In one embodiment, the first portion 610 comprises a substrate pedestal 604, a sidewall 616 and a vacuum pump 614. The second portion 612 comprises a lid 618 and a gas distribution plate (showerhead) 620, which defines a gas mixing volume 622 and a reaction volume 624. The lid 618 and sidewall 616 are generally formed from a metal (e.g., aluminum (Al), stainless steel, and the like) and electrically coupled to a ground reference 660.

The substrate pedestal 604 supports a substrate (wafer) 626 within the reaction volume 624. In one embodiment, the substrate pedestal 604 may comprise a source of radiant heat, such as gas-filled lamps 628, as well as an embedded resistive heater 630 and a conduit 632. The conduit 632 provides a gas (e.g., helium) from a source 634 to the backside of the wafer 626 through grooves (not shown) in the wafer support surface of the pedestal 604. The gas facilitates heat exchange between the support pedestal 604 and the wafer 626. The temperature of the wafer 626 may be controlled between about 20 and 400 degrees Celsius.

The vacuum pump 614 is adapted to an exhaust port 636 formed in the sidewall 616 of the process chamber 602. The vacuum pump 614 is used to maintain a desired gas pressure in the process chamber 102, as well as evacuate the post-processing gases and other volatile compounds from the chamber. In one embodiment, the vacuum pump 614 comprises a throttle valve 638 to control a gas pressure in the process chamber 602.

The process chamber 602 also comprises conventional systems for retaining and releasing the wafer 626, detecting an end of a process, internal diagnostics, and the like. Such systems are collectively depicted as support systems 640.

The remote plasma source 606 comprises a power source 646, a gas panel 644, and a remote plasma chamber 642. In one embodiment, the power source 646 comprises a radio-frequency (RF) generator 648, a tuning assembly 650, and an applicator 652. The RF generator 648 is capable of producing of about 200 to 5000 W at a frequency of about 200 to 600 kHz. The applicator 652 is inductively coupled to the remote plasma chamber 642 and energizes a process gas (or gas mixture) 664 to a plasma 662 in the chamber. In this embodiment, the remote plasma chamber 642 has a toroidal geometry that confines the plasma and facilitates efficient generation of radical species, as well as lowers the electron temperature of the plasma. In other embodiments, the remote plasma source 606 may be a microwave plasma source, however, the stripping rates are generally higher using the inductively coupled plasma.

The gas panel 644 uses a conduit 666 to deliver the process gas 664 to the remote plasma chamber 642. The gas panel 644 (or conduit 666) comprises means (not shown), such as mass flow controllers and shut-off valves, to control gas pressure and flow rate for each individual gas supplied to the chamber 642. In the plasma 662, the process gas 664 is ionized and dissociated to form reactive species.

The reactive species are directed into the mixing volume 622 through an inlet port 668 in the lid 618. To minimize charge-up plasma damage to devices on the wafer 626, the ionic species of the process gas 664 are substantially neutralized within the mixing volume 622 before the gas reaches the reaction volume 624 through a plurality of openings 670 in the showerhead 620.

The controller 608 comprises a central processing unit (CPU) 654, a memory 656, and a support circuit 658. The CPU 654 may be of any form of a general-purpose computer processor used in an industrial setting. Software routines can be stored in the memory 656, such as random access memory, read only memory, floppy or hard disk, or other form of digital storage. The support circuit 658 is conventionally coupled to the CPU 654 and may comprise cache, clock circuits, input/output sub-systems, power supplies, and the like.

The software routines, when executed by the CPU 654, transform the CPU into a specific purpose computer (controller) 608 that controls the reactor 600 such that the processes are performed in accordance with the present invention. The software routines may also be stored and/or executed by a second controller (not shown) that is located remotely from the reactor 600.

The invention can be practiced using other processes wherein parameters are adjusted to achieve acceptable characteristics by those skilled in the art by utilizing the teachings disclosed herein without departing from the spirit of the invention. Although the forgoing discussion referred to fabrication of field effect transistors, fabrication of other devices and structures used in the integrated circuits can also benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A cluster tool facilitating process integration in manufacture of a gate structure of a field effect transistor having a high-k dielectric, comprising:
    at least one first etch reactor configured to etch a high-k dielectric material comprising at least one of hafnium dioxide ($HfO_2$), hafnium silicate ($HfSiO_2$), or hafnium silicon oxynitride (HfSiON);
    at least one second etch reactor configured to etch polysilicon or a metal;
    at least one ashing reactor;
    at least one load-lock chamber;
    a vacuum-tight substrate transfer chamber coupled to the at least one first etch reactor, the at least one second etch reactor, the at least one ashing reactor, and the at least one load-lock chamber;
    an input/output module, coupled to the at least one load-lock chamber, comprising at least one substrate robot and a metrology tool employing a non-destructive optical measuring technique;
    a controller; and
    computer readable media, containing instruction, that when executed by the controller, cause the tool to perform a method in-situ the tool including the steps of:
        (a) measuring pre-trim dimensions of a patterned photoresist mask of the gate structure to define a trimming process;
        (b) trimming the patterned photoresist mask to a pre-determined width;
        (c) forming beneath the patterned photoresist mask a hard mask comprising an anti-reflective coating disposed upon a film comprising α-carbon;
        (d) fabricating the gate structure using a plasma etch process to form the high-k gate dielectric; and
        (e) measuring dimensions of the gate structure to adjust the trimming process.

2. The cluster tool of claim 1, wherein the at least one second etch reactor is configured to etch polysilicon.

3. The cluster tool of claim 2, further comprising:
    a third etch reactor configured to etch polysilicon.

4. The cluster tool of claim 3, wherein the ashing reactor further comprises:
    a process chamber having a reaction volume;
    a substrate pedestal disposed within the reaction volume;
    a gas distribution plate disposed within the process chamber and separating a mixing volume from the reaction volume; and
    a remote plasma source adapted to direct reactive species into the mixing volume through an inlet port formed through the process chamber.

5. The cluster tool of claim 4, wherein the remote plasma source further comprises:
    a remote plasma chamber coupled to the inlet port;
    a radio-frequency (RF) generator; and
    an applicator inductively coupling power from the generator to the remote plasma chamber.

6. The cluster tool of claim 4, wherein the remote plasma chamber further comprises:
    a toroidal geometry.

7. The cluster tool of claim 3, wherein the computer readable media further comprises instructions that, when executed by the controller, cause the cluster tool to perform the steps of:
    transferring a substrate to one of the at least one first etch reactors;
    flowing a gate dielectric etchant into the at least one first etch reactor;
    transferring the substrate to one of the at least one second etch reactors;
    flowing a high-k etchant into the at least one second etch reactor;
    transferring the substrate to the third etch reactor; and
    removing a hard mask from the substrate in the third etch reactor.

8. The cluster tool of claim 7, wherein the computer readable media further comprises instructions that, when executed by the controller, cause the cluster tool to perform the steps of:
    measuring critical dimensions on the cluster tool of a resist mask prior to transferring the substrate to the at least one first etch reactor;
    measuring critical dimensions on the cluster tool of an etched structure after removing the substrate from the at least one first etch reactor; and
    determining if critical dimensions of the resist mask require adjustment on subsequently processed substrates.

9. A cluster tool for fabricating a gate structure of a field effect transistor having a high-k gate dielectric, comprising:
    a transfer chamber having a robot configured to transfer substrates between processing chambers;
    an etch reactor coupled to the transfer chamber and configured for etching at least one of photoresist, an anti-reflective coating, and α-carbon;
    two etch reactors each coupled to the transfer chamber and configured for etching at least one of a high-k dielectric material—comprising at least one of hafnium dioxide ($HfO_2$), hafnium silicate ($HfSiO_2$), or hafnium silicon oxynitride (HfSiON)—polysilicon, and a metal;
    an etch reactor coupled to the transfer chamber and configured for removing at least one of photoresist and α-carbon;
    two load-lock chambers coupled to the transfer chamber;
    an input/output module, coupled to the two load-lock chambers, comprising at least one substrate robot and a metrology tool employing a non-destructive optical measuring technique;
    a controller; and
    computer readable media, containing instruction, that when executed by the controller, cause the tool to perform a method in-situ the tool including the steps of:
        (a) measuring pre-trim dimensions of a patterned photoresist mask of the gate structure to define a trimming process;
        (b) trimming the patterned photoresist mask to a pre-determined width;
        (c) forming beneath the patterned photoresist mask a hard mask comprising an anti-reflective coating disposed upon a film comprising α-carbon;
        (d) fabricating the gate structure using a plasma etch process to form the high-k gate dielectric; and
        (e) measuring dimensions of the gate structure to adjust the trimming process.

10. A cluster tool facilitating process integration in manufacture of a gate structure of a field effect transistor having a high-k dielectric, comprising:
    at least one first etch reactor configured to etch a high-k dielectric material;
    a second and a third etch reactor configured to etch polysilicon;

at least one ashing reactor;

at least one load-lock chamber;

a vacuum-tight substrate transfer chamber coupled to the at least one first etch reactor, the second etch reactor, the at least one ashing reactor, and the at least one load-lock chamber;

an input/output module, coupled to the at least one load-lock chamber, comprising at least one substrate robot and a metrology tool employing a non-destructive optical measuring technique;

a controller; and computer readable media containing a plurality of instructions that, when executed by the controller, cause the cluster tool to perform the steps of:

transferring a substrate to one of the at least one first etch reactors;

flowing a gate dielectric etchant into the at least one first etch reactor;

transferring the substrate to the second etch reactor;

flowing a high-k etchant into the second etch reactor;

transferring the substrate to the third etch reactor; and removing a hard mask from the substrate in the third etch reactor.

11. The cluster tool of claim 10, wherein the computer readable media further comprises instructions that, when executed by the controller, cause the cluster tool to perform the steps of:

measuring critical dimensions on the cluster tool of a resist mask prior to transferring the substrate to the at least one first etch reactor;

measuring critical dimensions on the cluster tool of an etched structure after removing the substrate from the at least one first etch reactor; and determining if critical dimensions of the resist mask require adjustment on subsequently processed substrates.

* * * * *